US011632128B2

(12) United States Patent
Sethi et al.

(10) Patent No.: US 11,632,128 B2
(45) Date of Patent: Apr. 18, 2023

(54) DETERMINING COMPRESSION LEVELS TO APPLY FOR DIFFERENT LOGICAL CHUNKS OF COLLECTED SYSTEM STATE INFORMATION

(71) Applicant: Dell Products L.P., Round Rock, TX (US)

(72) Inventors: Parminder Singh Sethi, Ludhiana (IN); Lakshmi Saroja Nalam, Bangalore (IN); Durai S. Singh, Chennai (IN)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/380,187

(22) Filed: Jul. 20, 2021

(65) Prior Publication Data
US 2022/0393698 A1    Dec. 8, 2022

(30) Foreign Application Priority Data
Jun. 7, 2021   (IN) .............................. 202141025247

(51) Int. Cl.
*H03M 7/30*     (2006.01)
*G06N 20/00*    (2019.01)
(Continued)

(52) U.S. Cl.
CPC .......... *H03M 7/60* (2013.01); *G06F 11/1451* (2013.01); *G06F 11/1469* (2013.01); *G06N 20/00* (2019.01); *H04L 67/10* (2013.01)

(58) Field of Classification Search
CPC .................. H03M 7/60; G06F 11/1451; G06F 11/1469; G06N 20/00; H04L 67/10
See application file for complete search history.

(56) References Cited

U.S. PATENT DOCUMENTS 9,696,910 B2 *   7/2017  Manning ............... G06F 3/0608
10,223,008 B1 *  3/2019  Bigman ................ G06F 3/0661
(Continued)

OTHER PUBLICATIONS

D. Berrar, "Bayes' Theorem and Naive Bayes Classifier," Encyclopedia of Bioinformatics and Computational Biology, vol. 1, Jan. 2018, 18 pages.

*Primary Examiner* — Gil H. Lee
*Assistant Examiner* — Chhian (Amy) Ling
(74) *Attorney, Agent, or Firm* — Ryan, Mason & Lewis, LLP

(57) ABSTRACT

An apparatus comprises a processing device configured to collect system state information from host devices, to split the collected system state information into logical chunks, and to determine, based at least in part on a plurality of factors, a compression level to be applied to each of the logical chunks. The plurality of factors comprise a first factor characterizing a time at which the collected system state information is needed at a destination device and at least a second factor characterizing resources available for at least one of performing compression of the collected system state information and transmitting the collected system state information over at least one network to the destination device. The processing device is further configured to apply the determined compression level to each of the logical chunks to generate compressed logical chunks, and to transmit the compressed logical chunks to the destination device.

20 Claims, 13 Drawing Sheets

(51) Int. Cl.
    *G06F 11/14*     (2006.01)
    *H04L 67/10*     (2022.01)

(56) References Cited

U.S. PATENT DOCUMENTS

| | | | |
|---|---|---|---|
| 2015/0212936 A1* | 7/2015 | Flynn | G06F 3/0688 |
| | | | 711/103 |
| 2020/0126669 A1* | 4/2020 | Nuernberg | G16H 40/63 |
| 2020/0241805 A1* | 7/2020 | Armangau | G06F 3/0659 |
| 2020/0249877 A1* | 8/2020 | McIlroy | G06F 16/1744 |
| 2021/0374587 A1* | 12/2021 | Gambetta | H03M 7/70 |
| 2022/0179757 A1* | 6/2022 | Degaonkar | G06F 11/1469 |

* cited by examiner

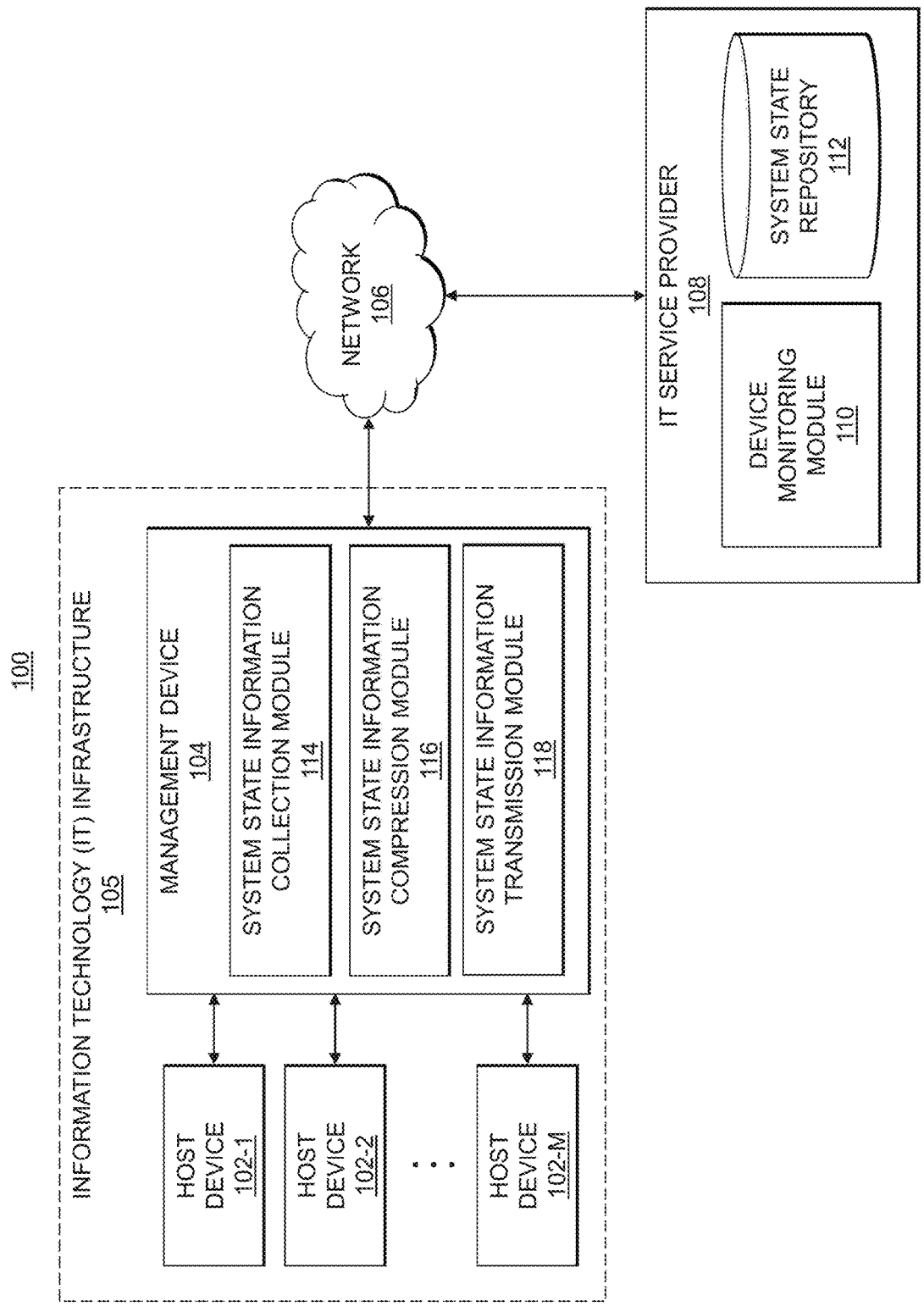

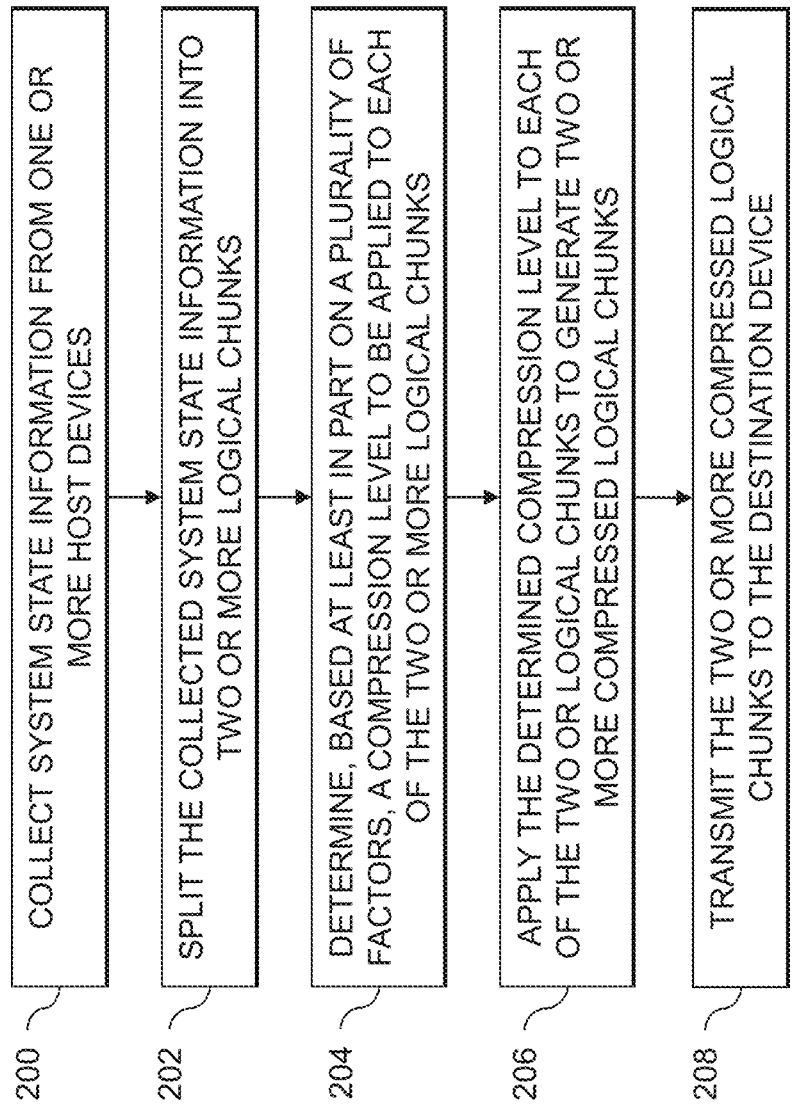

| TIME FILE NEEDED (A) | SIZE OF FILE GREATER THAN SIZE THRESHOLD (B) | STORAGE SPACE (C) | NETWORK THROUGHPUT (D) | SYSTEM UTILIZATION GREATER THAN SYSTEM UTILIZATION THRESHOLD (E) | MEMORY USAGE IS GREATER THAN MEMORY UTILIZATION THRESHOLD (F) | COMPRESSION LEVEL (G) |
|---|---|---|---|---|---|---|
| WITHIN 24 HOURS | YES | LESS | MORE | YES | YES | LOW |
| WITHIN 7 DAYS | YES | LESS | MORE | YES | YES | MEDIUM |
| BEYOND 7 DAYS | YES | LESS | MORE | YES | YES | LOW |
| WITHIN 24 HOURS | YES | MORE | LESS | NO | NO | HIGH |
| WITHIN 7 DAYS | YES | MORE | LESS | NO | NO | HIGH |
| BEYOND 7 DAYS | NO | MORE | LESS | NO | NO | MEDIUM |
| WITHIN 24 HOURS | NO | LESS | MORE | NO | NO | HIGH |
| WITHIN 7 DAYS | YES | LESS | MORE | NO | NO | LOW |
| BEYOND 7 DAYS | YES | LESS | MORE | NO | NO | HIGH |
| BEYOND 7 DAYS | YES | LESS | MORE | NO | NO | HIGH |

FIG. 4

| 505-1 | LOW | MEDIUM | HIGH |
|---|---|---|---|
| WITHIN 24 HOURS (A) | | | |
| $n$ | 3 | 2 | 5 |
| $n_c$ | 2 | 0 | 2 |
| $p$ | 0.33 | 0.33 | 0.33 |
| $m$ | 3 | 3 | 3 |
| FILE TO BE TRANSFERRED IS GREATER THAN SIZE THRESHOLD (B) | | | |
| $n$ | 3 | 2 | 5 |
| $n_c$ | 3 | 1 | 4 |
| $p$ | 0.5 | 0.5 | 0.5 |
| $m$ | 3 | 3 | 3 |
| STORAGE SPACE (C) | | | |
| $n$ | 3 | 2 | 5 |
| $n_c$ | 0 | 1 | 3 |
| $p$ | 0.5 | 0.5 | 0.5 |
| $m$ | 3 | 3 | 3 |

FIG. 5B

|  | LOW | MEDIUM | HIGH |
|---|---|---|---|
| NETWORK THROUGHPUT (D) | | | |
| $n$ | 3 | 2 | 5 |
| $n_c$ | 3 | 1 | 2 |
| $p$ | 0.5 | 0.5 | 0.5 |
| $m$ | 3 | 3 | 3 |
| SYSTEM UTILIZATION IS GREATER THAN SYSTEM UTILIZATION THRESHOLD (E) | | | |
| $n$ | 3 | 2 | 5 |
| $n_c$ | 2 | 1 | 0 |
| $p$ | 0.5 | 0.5 | 0.5 |
| $m$ | 3 | 3 | 3 |
| MEMORY USAGE IS GREATER THAN MEMORY UTILIZATION THRESHOLD (F) | | | |
| $n$ | 3 | 2 | 5 |
| $n_c$ | 2 | 1 | 0 |
| $p$ | 0.5 | 0.5 | 0.5 |
| $m$ | 3 | 3 | 3 |

| PROBABILITY OF SCENARIOS | | |
|---|---|---|
| $P(A\|Low) = 0.498333333$ | $P(A\|Medium) = 0.198$ | $P(A\|High) = 0.37375$ |
| $P(B\|Low) = 0.75$ | $P(B\|Medium) = 0.5$ | $P(B\|High) = 0.6875$ |
| $P(C\|Low) = 0.25$ | $P(C\|Medium) = 0.5$ | $P(C\|High) = 0.5625$ |
| $P(D\|Low) = 0.75$ | $P(D\|Medium) = 0.5$ | $P(D\|High) = 0.4375$ |
| $P(E\|Low) = 0.583333333$ | $P(E\|Medium) = 0.5$ | $P(E\|High) = 0.1875$ |
| $P(F\|Low) = 0.583333333$ | $P(F\|Medium) = 0.5$ | $P(F\|High) = 0.1875$ |

DETERMINING COMPRESSION LEVELS TO APPLY FOR DIFFERENT LOGICAL CHUNKS OF COLLECTED SYSTEM STATE INFORMATION

FIELD

The field relates generally to information processing, and more particularly to techniques for managing information processing systems.

BACKGROUND

Data centers may include large numbers of devices, such as servers, that may be centrally managed and monitored. Various applications and tools may be used by information technology (IT) administrators to effectively deploy, monitor and manage the devices. In some cases, management and monitoring of the devices in a data center may be performed by an IT service provider that is external to the data center. In such cases, information regarding the devices needs to be transmitted or uploaded from the data center to the IT service provider external to the data center.

SUMMARY

Illustrative embodiments of the present invention provide techniques for determining compression levels to apply for different logical chunks of collected system state information. In one embodiment, an apparatus comprises at least one processing device comprising a processor coupled to a memory. The at least one processing device is configured to perform the steps of collecting system state information from one or more host devices, splitting the collected system state information into two or more logical chunks, and determining, based at least in part on a plurality of factors, a compression level to be applied to each of the two or more logical chunks. The plurality of factors comprise a first factor characterizing a time at which the collected system state information is needed at a destination device and at least a second factor characterizing resources available for at least one of performing compression of the collected system state information and transmitting the collected system state information over at least one network to the destination device. The at least one processing device is further configured to perform steps of applying the determined compression level to each of the two or more logical chunks to generate two or more compressed logical chunks, and transmitting the two or more compressed logical chunks to the destination device.

These and other illustrative embodiments include, without limitation, methods, apparatus, networks, systems and processor-readable storage media.

BRIEF DESCRIPTION OF THE DRAWINGS

FIG. 1 is a block diagram of an information processing system configured for determining compression levels to apply for different logical chunks of collected system state information in an illustrative embodiment of the invention.

FIG. 2 is a flow diagram of an exemplary process for determining compression levels to apply for different logical chunks of collected system state information in an illustrative embodiment.

FIG. 4 shows a table of training data including historical compression information in an illustrative embodiment.

FIGS. 5A-5D show a process for recommending a compression level to be applied to a dataset in an illustrative embodiment.

DETAILED DESCRIPTION

Figure 3A:
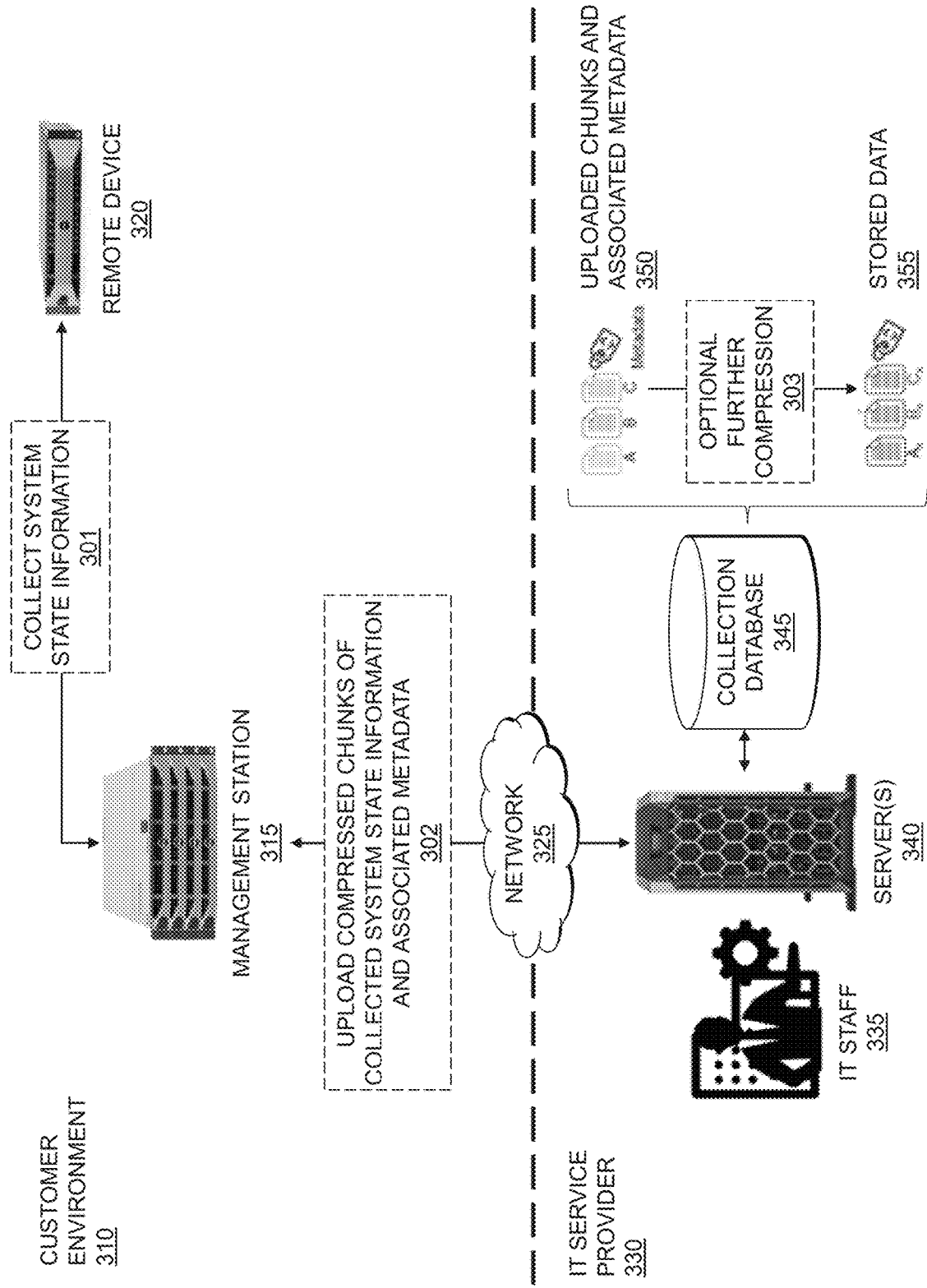
FIGS. 3A and 3B show a system flow for uploading compressed chunks of collected system state information from a customer environment to an information technology service provider in an illustrative embodiment.

Illustrative embodiments will be described herein with reference to exemplary information processing systems and associated computers, servers, storage devices and other processing devices. It is to be appreciated, however, that embodiments are not restricted to use with the particular illustrative system and device configurations shown. Accordingly, the term "information processing system" as used herein is intended to be broadly construed, so as to encompass, for example, processing systems comprising cloud computing and storage systems, as well as other types of processing systems comprising various combinations of physical and virtual processing resources. An information processing system may therefore comprise, for example, at least one data center or other type of cloud-based system that includes one or more clouds hosting tenants that access cloud resources.

FIG. 1 shows an information processing system 100 configured in accordance with an illustrative embodiment. The information processing system 100 is assumed to be built on at least one processing platform and provides functionality for determining compression levels to apply for different logical chunks of collected system state information. The information processing system 100 includes a set of host devices 102-1, 102-2, . . . 102-M (collectively, host devices 102) that are coupled to a management device 104. The management device 104 is coupled, via a network 106, to an information technology (IT) service provider 108. The IT service provider 108 is assumed to provide management, monitoring or other services for an IT infrastructure 105 comprising the host devices 102 and the management device 104.

The host devices 102 and management device 104 may comprise respective compute resources, which may include physical and virtual computing resources of the IT infrastructure 105. Physical computing resources may include physical hardware such as servers, storage systems, networking equipment, Internet of Things (IoT) devices, other types of processing and computing devices, etc. Virtual computing resources may include virtual machines (VMs), software containers, etc.

In some embodiments, the host devices 102 and management device 104 are assumed to comprise physical computing devices such as IoT devices, mobile telephones, laptop computers, tablet computers, desktop computers or other types of devices utilized by members of an enterprise, in any combination. Such devices are examples of what are more generally referred to herein as "processing devices." Some of these processing devices are also generally referred to herein as "computers." The host devices 102 and management device 104 may also or alternately comprise virtualized computing resources, such as VMs, software containers, etc.

The host devices 102 and management device 104 in some embodiments comprise respective computers associated with a particular company, organization or other enterprise. In addition, at least portions of the system 100 may also be referred to herein as collectively comprising an "enterprise." Numerous other operating scenarios involving a wide variety of different types and arrangements of processing nodes are possible, as will be appreciated by those skilled in the art.

The network 106 is assumed to comprise a global computer network such as the Internet, although other types of networks can be part of the network 106, including a wide area network (WAN), a local area network (LAN), a satellite network, a telephone or cable network, a cellular network, a wireless network such as a WiFi or WiMAX network, or various portions or combinations of these and other types of networks.

The IT service provider 108 in the FIG. 1 embodiment implements device monitoring module 110, which is configured to perform various management, monitoring or other tasks for the host devices 102 of the IT infrastructure 105. Such tasks may be performed using system state information that is uploaded or otherwise transferred via the network 106 from the management device 104. The system state information is stored in a system state repository 112. The system state repository 112 may be implemented using one or more storage systems or devices associated with the IT service provider 108. In some embodiments, one or more of such storage systems may comprise a scale-out all-flash content addressable storage array or other type of storage array.

The term "storage system" as used herein is therefore intended to be broadly construed, and should not be viewed as being limited to content addressable storage systems or flash-based storage systems. A given storage system as the term is broadly used herein can comprise, for example, network-attached storage (NAS), storage area networks (SANs), direct-attached storage (DAS) and distributed DAS, as well as combinations of these and other storage types, including software-defined storage.

Other particular types of storage products that can be used in implementing storage systems in illustrative embodiments include all-flash and hybrid flash storage arrays, software-defined storage products, cloud storage products, object-based storage products, and scale-out NAS clusters. Combinations of multiple ones of these and other storage products can also be used in implementing a given storage system in an illustrative embodiment.

Although not explicitly shown in FIG. 1, one or more input-output devices such as keyboards, displays or other types of input-output devices may be used to support one or more user interfaces to the host devices 102, the management device 104, the IT service provider 108, or components thereof, as well as to support communication between the host devices 102, the management device 104, the IT service provider 108 and other related systems and devices not explicitly shown.

The host devices 102 are assumed to be utilized by various different users. The term "user" herein is intended to be broadly construed so as to encompass numerous arrangements of human, hardware, software or firmware entities, as well as combinations of such entities.

In some embodiments, alerts or notifications generated by the management device 104 and/or the IT service provider 108 are provided to users of the host devices 102, or to system administrators, IT managers, or other authorized personnel of the IT infrastructure 105 via one or more host agents. Such host agents may be implemented via the host devices 102 or by other computing or processing devices associated with system administrators, IT managers or other authorized personnel that manage the host devices 102 in the IT infrastructure 105. Such devices can illustratively comprise mobile telephones, laptop computers, tablet computers, desktop computers, or other types of computers or processing devices configured for communication over network 106 with the host devices 102. For example, a given host agent may comprise a mobile telephone equipped with a mobile application configured to receive alerts or notifications from the management device 104 and/or IT service provider 108 (e.g., when new system state information is collected, proposed compression algorithms to be used for compressing collected system state information prior to transmission outside the IT infrastructure 105, when some actions are to be taken in response to analysis of collected system state information, etc.). The given host agent provides an interface for responding to such various alerts or notifications, such as by selecting whether to override a recommended compression algorithm to be applied to collected system state information prior to transmission, selecting whether to apply recommended actions based on the analysis of the collected system state information, etc., as described elsewhere herein.

It should be noted that a "host agent" as this term is generally used herein may comprise an automated entity, such as a software entity running on a processing device. Accordingly, a host agent need not be a human entity.

The host devices 102, the management device 104 and the IT service provider 108 in the FIG. 1 embodiment are assumed to be implemented using at least one processing device. Each such processing device generally comprises at least one processor and an associated memory, and implements one or more functional modules for controlling certain features of the host devices 102 (e.g., host agents), the management device 104 and the IT service provider 108.

In the FIG. 1 embodiment, the management device 104 comprises system state information collection module 114, system state information compression module 116, and system state information transmission module 118. The system state information collection module 114 is configured to collect system state information for the host devices 102 (e.g., for use in management, monitoring or other tasks performed by the device monitoring module 110 of the IT service provider 108). The system state information compression module 116 is configured to automatically select and apply a compression algorithm to the collected system state information prior to transmission to the IT service provider 108. The system state information transmission module 118 is configured to transmit the compressed system state information to the IT service provider 108 via the network 106. The IT service provider 108, on receiving the compressed system state information, may perform various management, monitoring or other tasks utilizing the device monitoring module 110. The IT service provider 108 may further store the received system state information (e.g., in the compressed form in which it was received from the management device 104, after applying further or different compression, encryption or other transformation to the system state information, etc.).

At least portions of the host agents, the device monitoring module 110, the system state information collection module 114, the system state information compression module 116, and the system state information transmission module 118 and other components of the information processing system 100 may be implemented at least in part in the form of software that is stored in memory and executed by processors of such processing devices.

It is to be appreciated that the particular arrangement of the host devices 102, the management device 104 and the IT service provider 108 illustrated in the FIG. 1 embodiment is presented by way of example only, and alternative arrangements can be used in other embodiments. For example, in some embodiments the functionality of the system state information collection module 114, the system state information compression module 116, and the system state information transmission module 118 are implemented internal to the host devices 102, such that the management device 104 may be omitted (e.g., each of the host devices 102 may collect, compress and transmit its system state information to the IT service provider 108 on its own rather than using the management device 104). As another example, the functionality associated with the system state information collection module 114, the system state information compression module 116, and the system state information transmission module 118 may be combined into one module, or separated across more than three modules with the multiple modules possibly being implemented with multiple distinct processors or processing devices.

It is to be understood that the particular set of elements shown in FIG. 1 for determining compression levels to apply for different logical chunks of collected system state information is presented by way of illustrative example only, and in other embodiments additional or alternative elements may be used. Thus, another embodiment may include additional or alternative systems, devices and other network entities, as well as different arrangements of modules and other components.

One or more of the host devices 102, the management device 104 and the IT service provider 108, in some embodiments, may be part of cloud infrastructure as will be described in further detail below.

The host devices 102, the management device 104, the IT service provider 108 and other components of the information processing system 100 in the FIG. 1 embodiment, are assumed to be implemented using at least one processing platform comprising one or more processing devices each having a processor coupled to a memory. Such processing devices can illustratively include particular arrangements of compute, storage and network resources.

The host devices 102, the management device 104 and the IT service provider 108, or components thereof, may be implemented on respective distinct processing platforms, although numerous other arrangements are possible. For example, in some embodiments at least portions of the host devices 102, the management device 104 and the IT service provider 108 are implemented on the same processing platform. A given host device (e.g., 102-1) can therefore be implemented at least in part within at least one processing platform that implements at least a portion of the management device 104 and/or the IT service provider 108.

The term "processing platform" as used herein is intended to be broadly construed so as to encompass, by way of illustration and without limitation, multiple sets of processing devices and associated storage systems that are configured to communicate over one or more networks. For example, distributed implementations of the system 100 are possible, in which certain components of the system reside in one data center in a first geographic location while other components of the system reside in one or more other data centers in one or more other geographic locations that are potentially remote from the first geographic location. Thus, it is possible in some implementations of the system 100 for the host devices 102, the management device 104 and the IT service provider 108, or portions or components thereof, to reside in different data centers. Numerous other distributed implementations are possible. The host devices 102, the management device 104 and the IT service provider 108 can also be implemented in a distributed manner across multiple data centers.

Additional examples of processing platforms utilized to implement portions of the information process system 100 of FIG. 1 in illustrative embodiments will be described in more detail below in conjunction with FIGS. 8 and 9.

It is to be appreciated that these and other features of illustrative embodiments are presented by way of example only, and should not be construed as limiting in any way.

An exemplary process for determining compression levels to apply for different logical chunks of collected system state information will now be described in more detail with reference to the flow diagram of FIG. 2. It is to be understood that this particular process is only an example, and that additional or alternative processes for determining compression levels to apply for different logical chunks of collected system state information can be carried out in other embodiments.

In this embodiment, the process includes steps 200 through 208. These steps are assumed to be performed at least in part by the management device 104 utilizing the system state information collection module 114, the system state information compression module 116, and the system state information transmission module 118. The process begins with step 200, collecting system state information from one or more host devices (e.g., host devices 102). The collected system state information is split into two or more logical chunks in step 202. In step 204, a compression level to be applied to each of the two or more logical chunks is determined based at least in part on a plurality of factors. The plurality of factors comprise a first factor characterizing a time at which the collected system state information is needed at a destination device and at least a second factor characterizing resources available for at least one of performing compression of the collected system state information and transmitting the collected system state information over at least one network to the destination device.

The FIG. 2 process continues with applying the determined compression level to each of the two or more logical chunks in step 206 to generate two or more compressed logical chunks, and transmitting the two or more compressed logical chunks to the destination device in step 208. The destination device may be associated with an IT service provider (e.g., IT service provider 108) that remotely manages the one or more host devices, where the one or more host devices are part of an IT infrastructure (e.g., IT infrastructure 105) and where the processing device performing the FIG. 2 method comprises a management station (e.g., management device 104) in the IT infrastructure.

The first factor characterizing the time at which the collected system state information is needed at the destination device may be determined based at least in part on a given one of two or more conditions that triggered collection of the system state information from the one or more host devices. The two or more conditions may comprise a first condition associated with detection of one or more issues on at least a given one of the one or more host devices, and at least a second condition associated with periodic collection of the system state information from the one or more host devices. The second factor characterizing resources available for at least one of performing compression of the collected system state information and transmitting the collected system state information over at least one network to the destination device may comprise at least one of: availability of at least one of compute, storage, memory and network resources at the at least one processing device; and availability of at least one of compute, storage, memory and network resources at the destination device.

The system state information collected from a given one of the one or more host devices may comprise state information for a plurality of components of the given host device. Step 202 may include splitting the collected system state information for the given host device into: at least a first logical chunk comprising state information for a first subset of the plurality of components associated with a first type of alerts; and at least a second logical chunk comprising state information for a second subset of the plurality of components associated with a second type of alerts. Step 202 may also or alternatively include identifying two or more levels of interest of the destination device for system state information collected from two or more subsets of the plurality of components of the given host device, and splitting the collected system state information for the given host device into: at least a first logical chunk comprising state information for a first one of the two or more subsets of the plurality of components associated with a first one of the two or more levels of interest of the destination device; and at least a second logical chunk comprising state information for a second one of the two or more subsets of the plurality of components associated with a second one of the two or more levels of interest of the destination device. Step 204 may comprise utilizing one or more machine learning algorithms trained utilizing historical data comprising, for each of a plurality of historical logical chunks of collected state information, values for the plurality of factors and the compression level applied to each of the plurality of historical logical chunks of collected state information. The one or more machine learning algorithms may comprise a Naïve Bayes algorithm.

In some embodiments, the FIG. 2 process further includes generating metadata for each of the two or more compressed logical chunks, and step 208 includes transmitting the generated metadata to the destination device. The metadata generated for a given one of the two or more compressed logical chunks may characterize the compression level applied to the given one of the two or more compressed logical chunks. The metadata generated for a given one of the two or more compressed logical chunks may also or alternatively comprise information enabling the destination device to decompress the given one of the two or more compressed logical chunks to obtain a corresponding uncompressed logical chunk.

Device management and monitoring applications enable IT administrators to effectively deploy, monitor, and manage remote devices in an enterprise environment. These applications collect and upload system state information from each monitored remote device (e.g., at periodic intervals, when a critical alert is detected, in response to a user request, etc.). After the system state information is collected from various components of the remote device, the device management and monitoring application compresses the system state information (e.g., which may be in the form of multiple files) into a single compressed file. The compressed file is then uploaded by the device management and monitoring application (e.g., over a network such as the Internet) to an IT service provider's back-end database, data store or other repository.

Compression of the collected system state information advantageously reduces the file size and enables faster upload. A device management and monitoring application may be configured to apply the same compression logic irrespective of the type of collection (e.g., periodic, alert-based, etc.). Such an approach, however, has various disadvantages as it does not take into consideration the context of the collected system state information. For example, system state information collected in response to an alert generated by a remote device may be critical for helping the IT service provider (e.g., IT staff thereof, such as an IT helpdesk) to detect underlying issues and provide solutions (e.g., recommended remedial actions for resolving the detected issues). Thus, it may be beneficial to apply different compression algorithms to collected system state information based on the context of the data collection.

Illustrative embodiments provide a framework for automatically determining the optimal context-based compression algorithm to be applied for system state information files prior to transfer or upload to the back-end database. It should be noted that while various embodiments are described herein with respect to selecting an optimal context-based compression algorithm for data that includes system state information collected from remotely managed devices, embodiments are not limited solely to this use case. The techniques described herein may be used in various other use cases, including for other types of data that is to be transmitted over a network where it would be beneficial to determine and apply optimal context-based compression algorithms to the data. As one non-limiting illustrative example, the techniques described herein for selecting and applying context-based compression algorithms may be used for data that is to be transmitted to remotely managed devices (e.g., rather than or in addition to selecting and applying context-based compression algorithms for data that is collected from remotely managed devices).

The transfer or upload of large size files over an intranet, the Internet or another type of network is a common operation that may be performed by device management and monitoring applications. Device management and monitoring applications may be installed on a management station, appliance or other device (e.g., management device 104) to enable monitoring of managed nodes (e.g., host devices 102) in enterprise IT environments (e.g., IT infrastructure 105). In some embodiments, the managed nodes are referred to as "remote" devices as they may be remotely managed by some entity (e.g., IT service provider 108) that is potentially external to an enterprise IT environment where the managed nodes are located. Device management and monitoring applications installed on a management station, appliance or other device can push files to managed nodes. Files pushed to the managed nodes may include, but are not limited to, drivers, firmware, software updates or upgrades, etc.

Device management and monitoring applications may also or alternatively regularly collect system state information from the managed nodes (e.g., various attributes relating to components of the managed nodes, including but not limited to components such as processors, memory, fans, storage devices, operating systems (OSes) or other applications running on the managed nodes, etc.). After collecting the system state information, the device management and monitoring application may compress the collected attribute files, and upload the collected attributes files as a single compressed file, over a network (e.g., the Internet) to an IT service provider's back-end database, data store or other repository. Compression of the collected system state information reduces the overall file size and enables faster transfer or upload of the file. The size of the compressed collection file may vary depending on the type and the configuration of the managed node.

Device management and monitoring applications may trigger the collection and upload of system state information in response to various detected conditions, including but not limited to: immediately after a critical event (e.g., an alert) is detected on the remote device; as part of a routine (e.g., periodic) collection; in response to a user request; in response to detecting some threshold change in the system state since a last collection; etc. The attributes or system state information that is collected from a remote device may vary in importance based on the detected condition which triggered the collection and upload of the system state information. In some scenarios (e.g., in response to a critical event), the collected system state information from a remote device may be more important than the system state information that is collected from the remote device in other scenarios (e.g., routine, periodic or other regular collection). For example, the attributes or system state information collected in response to a critical event may be used by an IT service provider's helpdesk to identify and resolve underlying issues in a timely manner.

File compression may be applied to collected system state information by the device management and monitoring applications prior to transmission or upload to another entity (e.g., an IT service provider). A simple approach may apply or utilize the same compression logic irrespective of the criticality or importance of the collected system state information. In other words, the same type of compression logic may be used for system state information irrespective of the need for the collected system information (e.g., whether the system state information collection was triggered by an alert on a remote device or whether the collection is regular or periodic). For collections triggered due to an alert, however, the collected system information may be critical as it is required to solve an underlying issue on the remote device and thus it may be desired to perform a different type of compression than that used for periodically or regularly collected system state information. Further, the compression logic applied is typically the same regardless of the workload or status of the device performing the compression (e.g., a management station, appliance or other device). Based on the workload or status of the management device performing compression (e.g., CPU utilization, memory utilization, available storage space, etc.), it can be advantageous to utilize different types of compression.

Figure 3B:
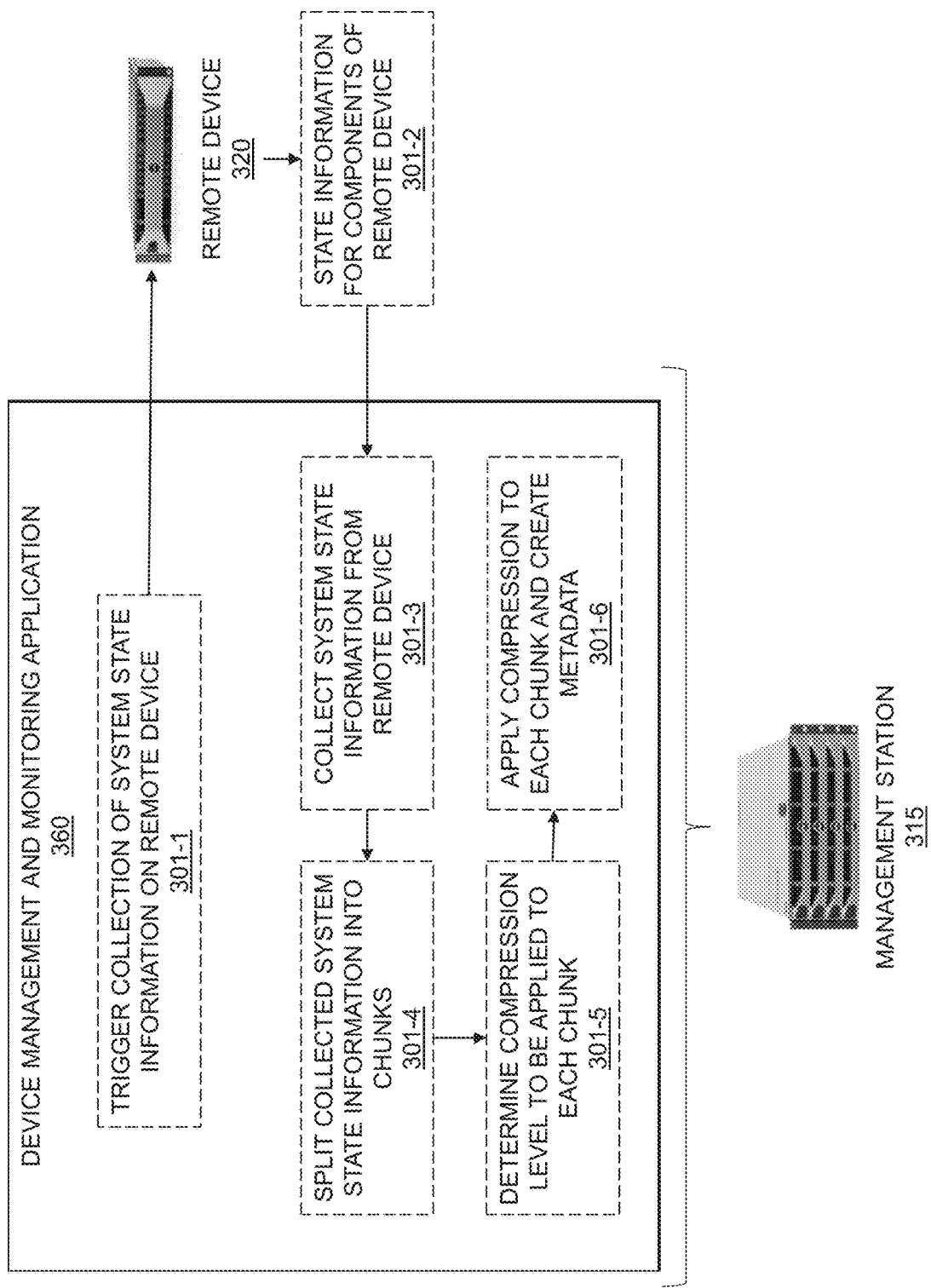

In some embodiments, after system state information is collected by a device management and monitoring application, the device management and monitoring application will: split the collected system state information into logical chunks; determine a compression level to be applied for each chunk; and compress the chunks and create associated metadata. FIGS. 3A and 3B illustrate a system flow for performing such tasks. As shown in FIG. 3A, there is a customer environment 310 (e.g., an example of the IT infrastructure 105) including a management station 315 (e.g., an example of the management device 104) which collects system state information in step 301 from a remote device 320 (e.g., an example of one of the host devices 102). The management station 315 in the customer environment 310 then uploads via a network 325 (e.g., the Internet) the compressed chunks of collected system state information and associated metadata to an IT service provider 330 (e.g., an example of the IT service provider 108) in step 302. The IT service provider 330 includes IT staff 335, one or more servers 340, and a collection database 345 (e.g., an example of the system state repository 112). In step 303, the IT service provider 330 (using IT staff 335 and/or servers 340) may perform optional further or different compression (possibly in combination with other types of transformation, such as encryption) to the uploaded chunks and associated metadata 350 to produce the data 355 stored in the collection database 345. FIG. 3B illustrates a device management and monitoring application 360 that runs on the management station 315, as well as detailed tasks that are performed as part of collecting the system state information in step 301. In step 301-1, the device management and monitoring application 360 triggers collection of system state information on the remote device 320. It should be noted that this "triggering" may be automatic in response to various detected conditions or events. Such events may include, but are not limited to: detecting an alert on the remote device 320; expiration of a regular or periodic collection interval; a user request (e.g., initiated by one or more users in the customer environment 310, by the IT staff 335 of the IT service provider 330, etc.); etc. State information for one or more components of the remote device 320 is then returned to the device management and monitoring application 360 in step 301-2. In step 301-3, the device management and monitoring application 360 receives the collected system state information from the remote device 320.

In step 301-4, the device management and monitoring application 360 splits the collected system state information into logical chunks. The splitting of collected system state information may be based on various factors, including the type of collection (e.g., alert-based, periodic, etc.), primary components and associated components of the remote device 320 that are of importance or interest to the IT staff 335 of the IT service provider 330, the number of CPU cores or other resources of the management station 315 where the device management and monitoring application 360 runs, etc. It should further be noted that system state information may be collected from a group of managed nodes or remote devices (e.g., host devices 102), although just a single remote device 320 is shown in FIGS. 3A and 3B for clarity of illustration. Where collected system state information includes data from multiple managed nodes or remote devices, the collected system state information may be split on various factors associated with the managed nodes or remote devices (e.g., the type of device, applications installed on the remote devices, functions or roles of the remote devices at the customer site 310, etc.).

For alert-based collection of system state information from the remote device 320, a first chunk (e.g., Chunk 1) may include attributes from a given component of the remote device 320 that resulted in the alert (issue) as well as other components of the remote device 320 that are related to the given component and may be impacted by the issue. Other chunks (e.g., Chunk 2, Chunk 3, etc.) may include attributes from other components of the remote device 320 based on the significance of alerts (e.g., critical alerts, warning alerts, information alerts, default alerts, etc.) associated therewith.

For periodic and manually-triggered collection of system state information from the remote device 320, the splitting of the data into chunks may be based on open alerts for the remote device 320. Open alerts for the remote device 320 can be identified in the device management and monitoring application 360. In such an approach: a first set of chunks (e.g., Chunk 1) may be used for critical alerts and contain attributes of underlying components (and possibly related components) that resulted in the critical alerts; a second set of chunks (e.g., Chunk 2) may be used for warning alerts and contain attributes of underlying components (and possibly related components) that resulted in the warning alerts; a third set of chunks (e.g., Chunk 3) may be used for information alerts and contain attributes of underlying components (and possibly related components) that resulted in the information alerts; and a fourth set of chunks (e.g., Chunk 4) may be used for default alerts and contain attributes of underlying components (and possibly related components) that resulted in the default alerts (e.g., attributes of all components that have a healthy status). If there are no open alerts for the remote device 320, then step 301-4 may be skipped and the same type of compression logic may be applied to all of the collected system state information.

In step 301-5, a compression level to be applied for each chunk is determined. In some embodiments, the device management and monitoring application 360 utilizes a learning system (e.g., a machine learning system) such as a Naïve Bayes algorithm to determine an appropriate or optimal compression level (e.g., low, medium, high, etc.) to be applied to each collection chunk. The learning system is advantageously trained to provide recommendations for the compression level to be used based on multiple factors, including but not limited to: (A) the need of the collected system state information at the source (e.g., the management station 315) and the destination (e.g., the collection database 345 of the IT service provider 330), where the need may be characterized as whether the collected system state information is needed urgently, within 24 hours, etc.; (B) the size of the collected system state information; (C) the availability of storage space (e.g., at one or both of the management station 315 and the collection database 345); (D) network bandwidth availability (e.g., of the network 325 coupling the management station 315 at the customer site 310 to the servers 340 at the IT service provider 330); (E) system utilization (e.g., CPU utilization) at the management station 315 running the device management and monitoring application 360; (F) memory utilization at the management station 315 running the device management and monitoring application 360; etc.

As noted above, the device management and monitoring application 360 may utilize a machine learning algorithm to generate recommendations for the compression level to be applied to each chunk of the collected system state information. In some embodiments, a Naïve Bayes algorithm is used. The Naïve Bayes algorithm is a supervised learning algorithm based on Bayes theorem. The Naïve Bayes algorithm is advantageously a simple but highly effective classification algorithm which enables making quick predictions based on the probability of an object. The formula for determining the most likely classification $V_{nb}$ using the Naïve Bayes algorithm is:

$$V_{nb} = \mathrm{argmax}_{v_j \in V} P(v_j) \Pi P(a_i | v_j)$$

where $a_1, a_2, a_3, a_4, \ldots, a_n$ are attributes. $P(a_i|v_j)$ may be estimated using m-estimates using the following formula:

$$P(a_i | v_j) = \frac{n_c + mp}{n + m}$$

where n is the number of training examples for which $v=v_j$ and $a=a_i$, p is an a priori estimate for $P(a_i|v_j)$, and m is the equivalent sample size.

FIG. 4 shows a table 400 of an example training dataset generated by the learning system based on historical compression information. This dataset may be used as the basis for identifying and recommending a compression level to be applied for future data sets. The table 400 includes columns for the various factors (A)-(F) described above, along with a compression level (G) that was applied to that dataset.

Figure 5A:
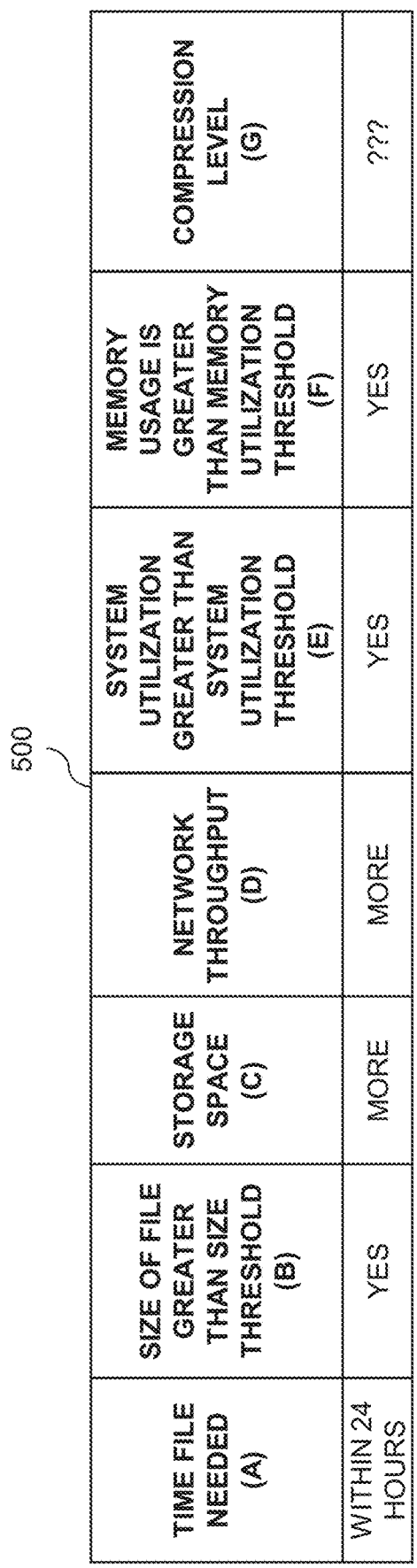

An example of application of the Naïve Bayes algorithm will now be described with respect to FIGS. 5A-5D. FIG. 5A shows a table 500 illustrating factors for a new dataset (e.g., a collection chunk) that is to be compressed. As shown, the values for factors (A)-(F) are known while the value for (G), the compression level to be applied, is to be determined. The probabilities for each of the scenarios (A)-(F) are calculated against a set of compression levels, which in this example are low, medium and high compression, by using the formula $$P(a_i | v_j) = \frac{n_c + mp}{n + m}$$

described above. This would be:

P(A|Low);P(A|Medium);P(A|High)

P(B|Low);P(B|Medium);P(B|High)

P(C|Low);P(C|Medium);P(C|High)

P(D|Low);P(D|Medium);P(D|High)

P(E|Low);P(E|Medium);P(E|High)

P(F|Low);P(F|Medium);P(F|High)

FIGS. 5B and 5C show respective portions 505-1 and 505-2 of a table illustrating the calculation of the values n, $n_c$, p and m for each of the factors (A)-(F) for the low, medium and high compression levels. FIG. 5D shows a table 510 of the calculated probabilities for each scenario. From the training dataset (e.g., shown in the table 400 of FIG. 4), the determined probabilities of the compression levels low, medium and high are: P(Low)=0.3, P(Medium)=0.2, and P(High)=0.5. Next, the classification based on the current scenario (e.g., for the example in the table 500 of FIG. 5A) is determined as follows:

v(Low)=P(Low)*P(A|Low)*P(B|Low)*P(C|Low)*P(D|Low)*P(E|Low)P(F|Low)=0.007153809;

v(Medium)=P(Medium)*P(A|Medium)*P(B|Medium)*P(C|Medium)P(D|Medium)*P(E|Medium)*P(F|Medium)=0.0012375; and v(High)=P(High)*P(A|High)*P(B|High)*P(C|High)*P(D|High)*P(E|High)*P(F|High)=0.001111545.

As v(Low) is greater than v(Medium) and v(High) for this scenario, the low compression level should be applied.

Figure 6:
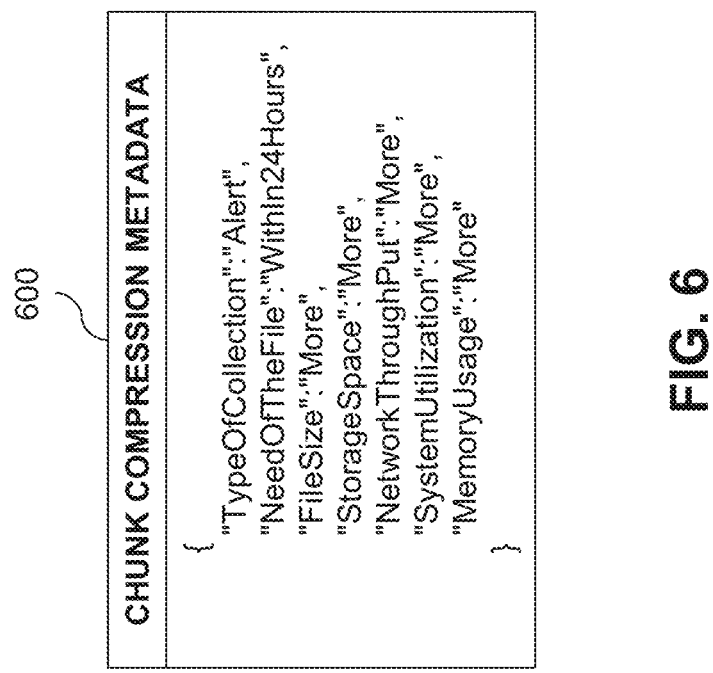
FIG. 6 shows an example of chunk metadata in an illustrative embodiment.

Returning to FIG. 3B, in step 301-6 the determined compression level is applied to each chunk of the collected system state information and metadata related to the compression is created. The individual compressed collection chunks and their associated metadata may then be uploaded from the management station 315 to the IT service provider 330 in step 302 as previously described. FIG. 6 shows an example 600 of metadata created during compression of a collection chunk. The metadata enables decompression or possible further compression (if desired) at the IT service provider 330 backend in step 303. Irrespective of the compression applied to a collection chunk by the device management and monitoring application 360, at the IT service provider 330 backend the metadata will be parsed to determine the context and level of compression. Then, depending on the IT service provider 330's need for the collected system state information (e.g., short-term use versus long-term use) as well as workload and resource availability of the servers 340 of the IT service provider 330, the collected system state information may be further compressed or uncompressed in step 303. Various other types of transformations (e.g., encryption) may be applied by the IT service provider 330 in addition to or in place of compression.

Figure 7:
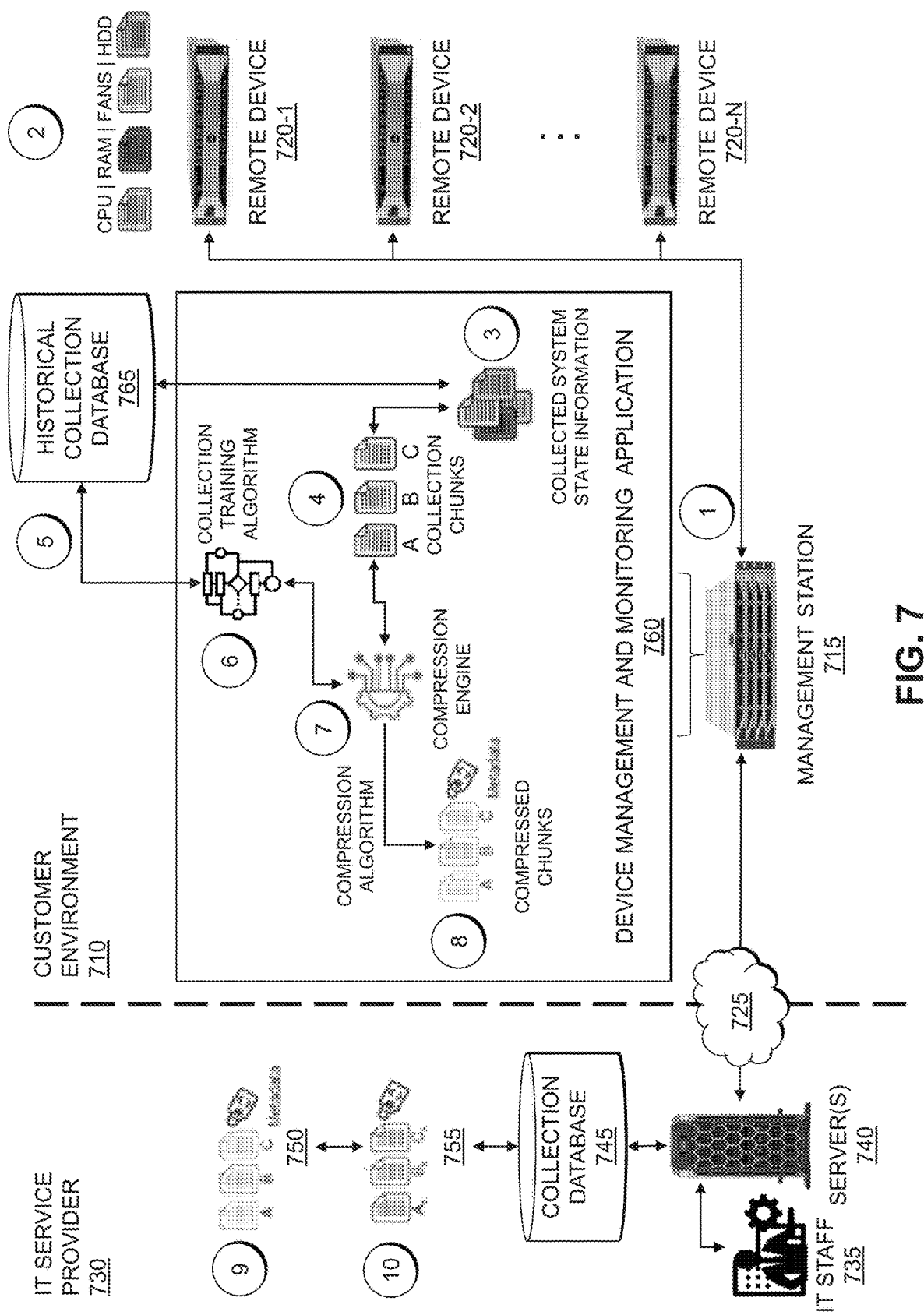
FIG. 7 shows a system flow for selecting and applying compression to system state information collected in a customer environment that is sent to an information technology service provider in an illustrative embodiment.

FIG. 7 shows an outline of a workflow used in some embodiments for determining the optimal context-based compression algorithm to be applied on files prior to transfer or upload. The system in FIG. 7 includes a customer environment 710, management station 715, remote devices 720-1, 720-2, ... 720-N (collectively, remote devices 720) network 725, IT service provider 730, IT staff 735, servers 740, collection database 745, uploaded chunks and associated metadata 750, stored data 755 and device management and monitoring application 760 configured in a manner similar to that of like-numbered elements in FIGS. 3A and 3B. FIG. 7 further shows a historical collection database 765 which is assumed to comprise datasets used for training of a machine learning algorithm (e.g., table 400 in FIG. 4). The workflow of FIG. 7 will now be described:

1. The device management and monitoring application 760 on the management station 715 establishes a connection with the remote devices 720, and triggers collection of system state information.

2. The system state information of various components present in the remote devices 720 (e.g., CPU, RAM, fans, HDD component information for remote device 720-1) are captured and sent to the management station 715.

3. The collected system state information is received by the device management and monitoring application 760.

4. The device management and monitoring application 760 splits the collected system state information into logical chunks (e.g., based on the type of collection, primary components and associated components that are of importance or interest to the IT staff 735 or IT service helpdesk of the IT service provider 730, the number of CPU cores or other resources of the management station 715 where the device management and monitoring application 760 runs, etc.).

5. The device management and monitoring application 760 stores the logical chunks in the historical collection database 765, which may be implemented internal to the management station 715.

6. The latest and historical collection chunks are fed into a collection training algorithm that is used to classify the collected system state information.

7. Based on the current collection chunks, device type, server capabilities, resource availability and various other factors (e.g., need of the collected system state information at the source customer environment 710 or destination IT service provider 730, size of the collected system state information, storage availability, network bandwidth availability, CPU, memory and other resource utilization at the management station 715, etc.), the collection training algorithm directs a compression engine to apply an appropriate or optimal compression algorithm (e.g., low, medium, high, etc.) for each chunk of the collected system state information.

8. The compression engine of the device management and monitoring application 760 compresses each chunk of the collected system state information using the determined compression algorithm and creates associated compression metadata.

9. The device management and monitoring application 760 uploads the compressed chunks and their associated compression metadata 750 to the servers 740 of the IT service provider 730.

10. At the IT service provider 730 backend, the compression metadata is parsed to determine the context and compression level applied to each chunk. The IT service provider 730 optionally changes the compression level (e.g., by decompressing the chunks, by decompressing and applying different or further compression, etc.) before storing the data in the collection database 745. This optional change in compression level may be based on the need for the collected system state information at the IT service provider 730, resource availability at the IT service provider 730, etc.

Illustrative embodiments provide a number of advantages relative to conventional approaches. A novel context-based method is used to split collected system state information into multiple logical chunks based on various factors such as: the type of collection (e.g., alert-based, periodic, manual, etc.); the primary components and associated components of managed nodes that are of importance or interest to an IT service provider to which the collected system state information will be transmitted; the available resources at a management station that performs the splitting; etc. The context-based method is further used to predict the level of compression that is optimal or appropriate for each chunk of the collected system state information. The application of different compression algorithms (e.g., low, medium, high, etc.) to each chunk of the collected system state information can also be based on multiple factors such as the need for the collected system state information at the source (e.g., a management station in a customer environment) or the destination (e.g., an IT service provider), the size of the collected system state information, storage availability, network bandwidth availability, resource availability at the management station performing compression, etc. Further, the creation of metadata with compression details enables rebuilding of the files without loss of data at the source or destination, and further enables the destination to apply further or different compression as desired.

It is to be appreciated that the particular advantages described above and elsewhere herein are associated with particular illustrative embodiments and need not be present in other embodiments. Also, the particular types of information processing system features and functionality as illustrated in the drawings and described above are exemplary only, and numerous other arrangements may be used in other embodiments.

Illustrative embodiments of processing platforms utilized to implement functionality for determining compression levels to apply for different logical chunks of collected system state information will now be described in greater detail with reference to FIGS. 8 and 9. Although described in the context of system 100, these platforms may also be used to implement at least portions of other information processing systems in other embodiments.

Figure 8:
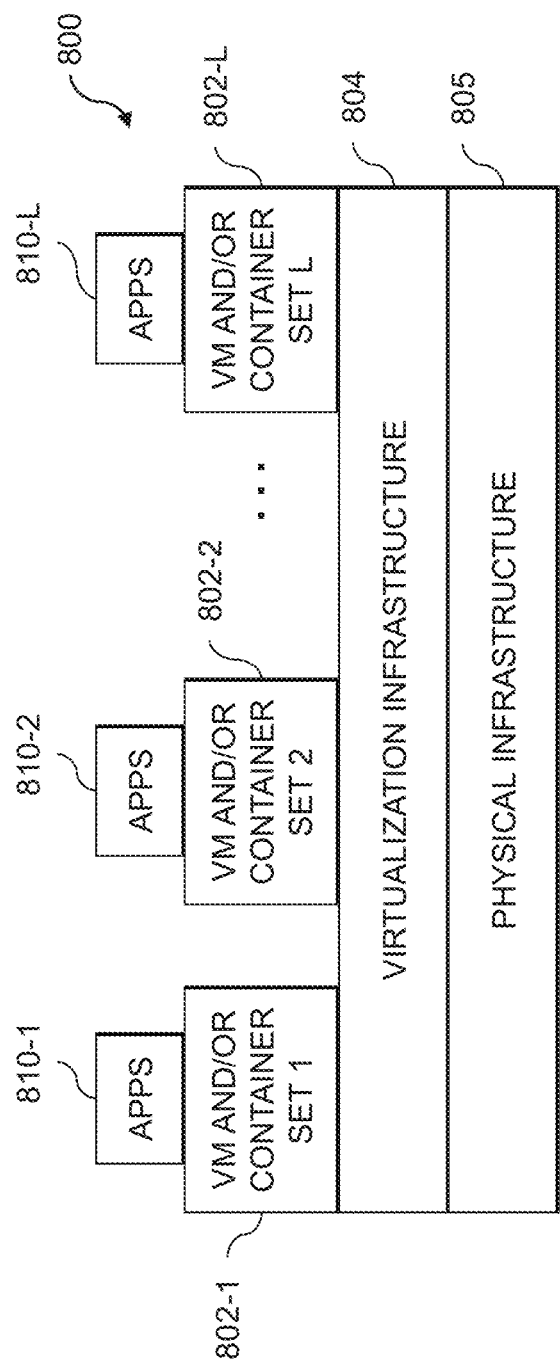
FIGS. 8 and 9 show examples of processing platforms that may be utilized to implement at least a portion of an information processing system in illustrative embodiments.
Figure 9:
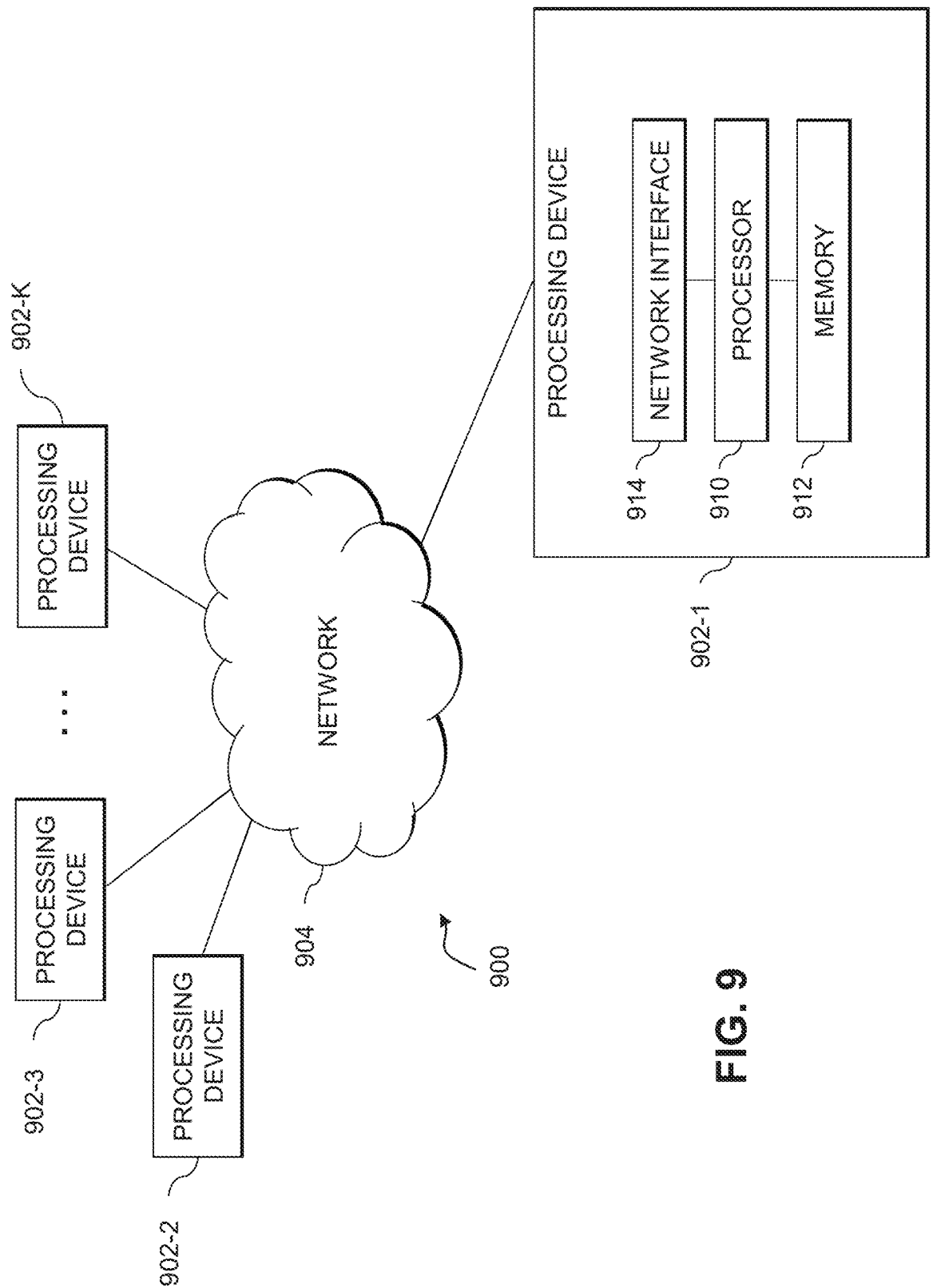

FIG. 8 shows an example processing platform comprising cloud infrastructure 800. The cloud infrastructure 800 comprises a combination of physical and virtual processing resources that may be utilized to implement at least a portion of the information processing system 100 in FIG. 1. The cloud infrastructure 800 comprises multiple virtual machines (VMs) and/or container sets 802-1, 802-2, ... 802-L implemented using virtualization infrastructure 804. The virtualization infrastructure 804 runs on physical infrastructure 805, and illustratively comprises one or more hypervisors and/or operating system level virtualization infrastructure. The operating system level virtualization infrastructure illustratively comprises kernel control groups of a Linux operating system or other type of operating system.

The cloud infrastructure 800 further comprises sets of applications 810-1, 810-2, ... 810-L running on respective ones of the VMs/container sets 802-1, 802-2, ... 802-L under the control of the virtualization infrastructure 804. The VMs/container sets 802 may comprise respective VMs, respective sets of one or more containers, or respective sets of one or more containers running in VMs.

In some implementations of the FIG. 8 embodiment, the VMs/container sets 802 comprise respective VMs implemented using virtualization infrastructure 804 that comprises at least one hypervisor. A hypervisor platform may be used to implement a hypervisor within the virtualization infrastructure 804, where the hypervisor platform has an associated virtual infrastructure management system. The underlying physical machines may comprise one or more distributed processing platforms that include one or more storage systems.

In other implementations of the FIG. 8 embodiment, the VMs/container sets 802 comprise respective containers implemented using virtualization infrastructure 804 that provides operating system level virtualization functionality, such as support for Docker containers running on bare metal hosts, or Docker containers running on VMs. The containers are illustratively implemented using respective kernel control groups of the operating system.

As is apparent from the above, one or more of the processing modules or other components of system 100 may each run on a computer, server, storage device or other processing platform element. A given such element may be viewed as an example of what is more generally referred to herein as a "processing device." The cloud infrastructure 800 shown in FIG. 8 may represent at least a portion of one processing platform. Another example of such a processing platform is processing platform 900 shown in FIG. 9.

The processing platform 900 in this embodiment comprises a portion of system 100 and includes a plurality of processing devices, denoted 902-1, 902-2, 902-3, ... 902-K, which communicate with one another over a network 904.

The network 904 may comprise any type of network, including by way of example a global computer network such as the Internet, a WAN, a LAN, a satellite network, a telephone or cable network, a cellular network, a wireless network such as a WiFi or WiMAX network, or various portions or combinations of these and other types of networks.

The processing device 902-1 in the processing platform 900 comprises a processor 910 coupled to a memory 912.

The processor 910 may comprise a microprocessor, a microcontroller, an application-specific integrated circuit (ASIC), a field-programmable gate array (FPGA), a central processing unit (CPU), a graphical processing unit (GPU), a tensor processing unit (TPU), a video processing unit (VPU) or other type of processing circuitry, as well as portions or combinations of such circuitry elements.

The memory 912 may comprise random access memory (RAM), read-only memory (ROM), flash memory or other types of memory, in any combination. The memory 912 and other memories disclosed herein should be viewed as illustrative examples of what are more generally referred to as "processor-readable storage media" storing executable program code of one or more software programs.

Articles of manufacture comprising such processor-readable storage media are considered illustrative embodiments. A given such article of manufacture may comprise, for example, a storage array, a storage disk or an integrated circuit containing RAM, ROM, flash memory or other electronic memory, or any of a wide variety of other types of computer program products. The term "article of manufacture" as used herein should be understood to exclude transitory, propagating signals. Numerous other types of computer program products comprising processor-readable storage media can be used.

Also included in the processing device 902-1 is network interface circuitry 914, which is used to interface the processing device with the network 904 and other system components, and may comprise conventional transceivers.

The other processing devices 902 of the processing platform 900 are assumed to be configured in a manner similar to that shown for processing device 902-1 in the figure.

Again, the particular processing platform 900 shown in the figure is presented by way of example only, and system 100 may include additional or alternative processing platforms, as well as numerous distinct processing platforms in any combination, with each such platform comprising one or more computers, servers, storage devices or other processing devices.

For example, other processing platforms used to implement illustrative embodiments can comprise converged infrastructure.

It should therefore be understood that in other embodiments different arrangements of additional or alternative elements may be used. At least a subset of these elements may be collectively implemented on a common processing platform, or each such element may be implemented on a separate processing platform.

As indicated previously, components of an information processing system as disclosed herein can be implemented at least in part in the form of one or more software programs stored in memory and executed by a processor of a processing device. For example, at least portions of the functionality for determining compression levels to apply for different logical chunks of collected system state information as disclosed herein are illustratively implemented in the form of software running on one or more processing devices.

It should again be emphasized that the above-described embodiments are presented for purposes of illustration only. Many variations and other alternative embodiments may be used. For example, the disclosed techniques are applicable to a wide variety of other types of information processing systems, system state information, compression algorithms, etc. Also, the particular configurations of system and device elements and associated processing operations illustratively shown in the drawings can be varied in other embodiments. Moreover, the various assumptions made above in the course of describing the illustrative embodiments should also be viewed as exemplary rather than as requirements or limitations of the disclosure. Numerous other alternative embodiments within the scope of the appended claims will be readily apparent to those skilled in the art.

What is claimed is:

1. An apparatus comprising:
at least one processing device comprising a processor coupled to a memory;

the at least one processing device being configured to perform steps of:

collecting system state information from one or more host devices;

splitting the collected system state information into two or more logical chunks based at least in part on information characterizing two or more different levels of interest in two or more different portions of the collected system state information, wherein the information characterizing the two or more different levels of interest comprises two or more different conditions which triggered collection of at least part of the two or more different portions of the collected system state information from two or more different subsets of a plurality of components of the one or more host devices;

determining, based at least in part on a plurality of factors, a first compression level to be applied to a first one of the two or more logical chunks and a second compression level to be applied to a second one of the two or more logical chunks, the second compression level being different than the first compression level, the plurality of factors comprising a first factor characterizing a time at which the collected system state information is needed at a destination device and at least a second factor characterizing resources available for at least one of performing compression of the collected system state information and transmitting the collected system state information over at least one network to the destination device;

applying the first compression level to the first one of the two or more logical chunks to generate a first compressed logical chunk;

applying the second compression level to the second one of the two or more logical chunks to generate a second compressed logical chunk; and transmitting the first and second compressed logical chunks to the destination device.

2. The apparatus of claim 1 wherein splitting the collected system state information comprises splitting the collected system state information for the given host device into:

at least the first logical chunk comprising state information for a first one of the two or more different subsets of the plurality of components associated with a first type of alerts; and at least the second logical chunk comprising state information for a second one of the two or more different subsets of the plurality of components associated with a second type of alerts.

3. The apparatus of claim 1 wherein splitting the collected system state information comprises splitting the collected system state information for the given host device into:

at least the first logical chunk comprising state information for a first one of the two or more different subsets of the plurality of components associated with a first one of the two or more different levels of interest; and at least the second logical chunk comprising state information for a second one of the two or more different subsets of the plurality of components associated with a second one of the two or more different levels of interest.

4. The apparatus of claim 1 wherein the first factor characterizing the time at which the collected system state information is needed at the destination device is determined based at least in part on a given one of two or more different conditions that triggered collection of the system state information from the one or more host devices.

5. The apparatus of claim 1 wherein the two or more different conditions comprise:

a first condition associated with detection of one or more issues on at least a given one of the one or more host devices; and at least a second condition associated with periodic collection of the system state information from the one or more host devices.

6. The apparatus of claim 1 wherein the second factor characterizing resources available for at least one of performing compression of the collected system state information and transmitting the collected system state information over at least one network to the destination device comprises at least one of:

availability of at least one of compute, storage, memory and network resources at the at least one processing device; and availability of at least one of compute, storage, memory and network resources at the destination device.

7. The apparatus of claim 1 wherein determining the compression level to be applied to each of the two or more logical chunks comprises utilizing one or more machine learning algorithms trained utilizing historical data comprising, for each of a plurality of historical logical chunks of collected state information, values for the plurality of factors and the compression level applied to each of the plurality of historical logical chunks of collected state information.

8. The apparatus of claim 7 wherein the one or more machine learning algorithms comprise a Naïve Bayes algorithm.

9. The apparatus of claim 1 wherein the destination device is associated with an information technology service provider that remotely manages the one or more host devices.

10. The apparatus of claim 9 wherein the one or more host devices are part of an information technology infrastructure, and wherein the at least one processing device comprises a management station in the information technology infrastructure.

11. The apparatus of claim 1 wherein the at least one processing device is further configured to perform the step of generating metadata for each of the first and second compressed logical chunks, and wherein transmitting the first and second compressed logical chunks to the destination device comprises transmitting the generated metadata to the destination device.

12. The apparatus of claim 11 wherein the metadata generated for the first and second compressed logical chunks characterizes the first and second compression levels applied to the first and second compressed logical chunks.

13. The apparatus of claim 11 wherein the metadata generated for a given one of the first and second compressed logical chunks comprises information enabling the destination device to decompress the given one of the first and second compressed logical chunks to obtain a corresponding uncompressed logical chunk.

14. A computer program product comprising a non-transitory processor-readable storage medium having stored therein program code of one or more software programs, wherein the program code when executed by at least one processing device causes the at least one processing device to perform steps of:

collecting system state information from one or more host devices;

splitting the collected system state information into two or more logical chunks based at least in part on information characterizing two or more different levels of interest in two or more different portions of the collected system state information, wherein the information characterizing the two or more different levels of interest comprises two or more different conditions which triggered collection of at least part of the two or more different portions of the collected system state information from two or more different subsets of a plurality of components of the one or more host devices;

determining, based at least in part on a plurality of factors, a first compression level to be applied to a first one of the two or more logical chunks and a second compression level to be applied to a second one of the two or more logical chunks, the second compression level being different than the first compression level, the plurality of factors comprising a first factor characterizing a time at which the collected system state information is needed at a destination device and at least a second factor characterizing resources available for at least one of performing compression of the collected system state information and transmitting the collected system state information over at least one network to the destination device;

applying the first compression level to the first one of the two or more logical chunks to generate a first compressed logical chunk;

applying the second compression level to the second one of the two or more logical chunks to generate a second compressed logical chunk; and transmitting the first and second compressed logical chunks to the destination device.

15. The computer program product of claim 14 wherein the destination device is associated with an information technology service provider that remotely manages the one or more host devices, wherein the one or more host devices are part of an information technology infrastructure, and wherein the at least one processing device comprises a management station in the information technology infrastructure.

16. The computer program product of claim 14 wherein the program code when executed by the at least one processing device further causes the at least one processing device to perform the step of generating metadata for each of the first and second compressed logical chunks, wherein transmitting the first and second compressed logical chunks to the destination device comprises transmitting the generated metadata to the destination device.

17. A method comprising:

collecting system state information from one or more host devices;

splitting the collected system state information into two or more logical chunks based at least in part on information characterizing two or more different levels of interest in two or more different portions of the collected system state information, wherein the information characterizing the two or more different levels of interest comprises two or more different conditions which triggered collection of at least part of the two or more different portions of the collected system state information from two or more different subsets of a plurality of components of the one or more host devices;

determining, based at least in part on a plurality of factors, a first compression level to be applied to a first one of the two or more logical chunks and a second compression level to be applied to a second one of the two or more logical chunks, the second compression level being different than the first compression level, the plurality of factors comprising a first factor characterizing a time at which the collected system state information is needed at a destination device and at least a second factor characterizing resources available for at least one of performing compression of the collected system state information and transmitting the collected system state information over at least one network to the destination device;

applying the first compression level to the first one of the two or more logical chunks to generate a first compressed logical chunk;

applying the second compression level to the second one of the two or more logical chunks to generate a second compressed logical chunk; and transmitting the first and second compressed logical chunks to the destination device;

wherein the method is performed by at least one processing device comprising a processor coupled to a memory.

18. The method of claim 17 wherein the destination device is associated with an information technology service provider that remotely manages the one or more host devices, wherein the one or more host devices are part of an information technology infrastructure, and wherein the at least one processing device comprises a management station in the information technology infrastructure.

19. The method of claim 17 further comprising generating metadata for each of the first and second compressed logical chunks, wherein transmitting the first and second compressed logical chunks to the destination device comprises transmitting the generated metadata to the destination device.

20. The method of claim 17 wherein the two or more different conditions comprise:

a first condition associated with detection of one or more issues on at least a given one of the one or more host devices; and at least a second condition associated with periodic collection of the system state information from the one or more host devices.

* * * * *